(12) United States Patent
Mani

(10) Patent No.: US 8,879,306 B2
(45) Date of Patent: Nov. 4, 2014

(54) MAGNETIC MEMORY CIRCUIT WITH STRESS INDUCING LAYER

(75) Inventor: Krishnakumar Mani, Santa Clara, CA (US)

(73) Assignee: III Holdings 1, LLC, Wilmington, DE (US)

( * ) Notice: Subject to any disclaimer, the term of this patent is extended or adjusted under 35 U.S.C. 154(b) by 120 days.

(21) Appl. No.: 13/208,577

(22) Filed: Aug. 12, 2011

(65) Prior Publication Data

US 2014/0254250 A1    Sep. 11, 2014

(51) Int. Cl.
*G11C 11/00*    (2006.01)

(52) U.S. Cl.
USPC ........... 365/158; 365/148; 365/171; 365/173; 977/933; 977/935

(58) Field of Classification Search
CPC ...................................................... G11C 11/00
USPC ......... 365/48, 55, 62, 66, 74, 78, 80–93, 100, 365/130, 131, 148, 158, 171–173, 209, 213, 365/225.5, 230.07, 232, 243.5; 257/295, 257/421, 422, 427, E21.665, E27.006; 438/3; 977/933–935
See application file for complete search history.

(56) References Cited

U.S. PATENT DOCUMENTS

| | | | |
|---|---|---|---|
| 7,394,626 B2 * | 7/2008 | Fukumoto et al. | 360/324.2 |
| 7,742,263 B2 * | 6/2010 | Fukumoto et al. | 360/324.2 |
| 2004/0145850 A1 * | 7/2004 | Fukumoto et al. | 361/143 |
| 2008/0278867 A1 * | 11/2008 | Fukumoto et al. | 360/324.12 |

* cited by examiner

*Primary Examiner* — Harry W Byrne
(74) *Attorney, Agent, or Firm* — McAndrews, Held & Malloy, Ltd.

(57) ABSTRACT

Memory circuit comprising an addressable magnetic tunnel junction (MTJ) stack, forming a magnetic storage element in the circuit. The MTJ stack comprises a tunnel oxide layer between a free layer and a fixed layer. A stress inducing layer is disposed adjacent to the free layer to provide tensile or compressive stress to the free layer, in order to manipulate a magnetic field that is required to write a bit into the MTJ stack. Method of using the memory circuit is also proposed.

13 Claims, 2 Drawing Sheets

MAGNETIC MEMORY CIRCUIT WITH STRESS INDUCING LAYER

FIELD

Embodiments of the invention relate to magnetic memory circuits using magnetic tunnel junction (MTJ) stacks.

BACKGROUND

Magnetic memory circuits are based on magneto-resistive behavior of magnetic storage elements that are integrated typically with a complementary metal-oxide-semiconductor (CMOS) technology. Such memory circuits generally provide non-volatility and an unlimited read and write capability. An example is the magnetic random access memory (MRAM) circuit that includes a plurality of bit cells, each defining an addressable magnetic storage element that may include a magnetic tunnel junction (MTJ) stack.

Each addressable MTJ stack can have a free layer whose magnetic spin orientation may be flipped between two states by the application of a magnetic field induced by energizing write conductors.

FIG. 1 illustrates a partly schematic and partly cross-sectional view of a commonly used magnetic bit cell 100. The bit cell 100 is generally usable in an array in magnetic memory circuits, such as magnetic random access memory (MRAM) circuits. An MTJ stack 120 is shown to form an addressable magnetic storage element in the bit cell 100. The MTJ stack 120 is generally designed to be integrated into a back-end metallization structure following a front-end CMOS processing. The MTJ stack 120 is shown to be provided between a first metallization layer Mx and a second metallization layer My, wherein the MTJ stack 120 is connected to the first layer Mx through a via hole 116 and to the second layer My through a via hole 104. The MTJ stack 120 includes a fixed layer 110, a tunnel oxide layer 108, a free layer 106 and an extended bottom electrode 112. The second layer My is patterned to include a bit line (BL) 102 corresponding to the MTJ stack 120. An address transistor 122 is also shown schematically that is connected to the first layer Mx by a connection 118a. The address transistor 122 is usable for reading the state of the MTJ stack 120. The first layer Mx is also patterned to include a read word line (WL) 118b for selectively operating the address transistor 122 and to include a write word line (WL) 118c for writing into the MTJ stack 120. The write WL 118c has no contact with the bottom electrode 112, and when energized, induces a magnetic field at a junction in the MTJ stack 120.

SUMMARY OF THE INVENTION

According to an embodiment of a first aspect of the invention, a memory circuit comprises an addressable magnetic tunnel junction (MTJ) stack forming a magnetic storage element in the circuit. The MTJ stack comprises a tunnel oxide layer between a free layer and a fixed layer. A stress inducing layer is disposed adjacent to the free layer, to provide tensile or compressive stress to the free layer in order to manipulate a magnetic field that is required to write a bit into the MTJ stack.

According to an embodiment of a second aspect of the invention, a method is proposed for operating an addressable magnetic tunnel junction (MTJ) stack that forms a magnetic storage element in a memory circuit. The method is to provide tensile or compressive stress to a free layer by a stress inducing layer, wherein the MTJ stack comprises a tunnel oxide layer between the free layer and a fixed layer, and wherein the stress inducing layer is disposed adjacent to the free layer. The method is to further manipulate a magnetic field that is required to write a bit into the MTJ stack, under the stress.

According to embodiments of the two aspects of the invention, the memory circuit comprises an array of the MTJ stacks.

According to embodiments of the two aspects of the invention, a dummy layer is disposed between the free layer and the stress inducing layer.

According to embodiments of the two aspects of the invention, the stress inducing layer comprises a metal.

According to embodiments of the two aspects of the invention, the stress inducing layer comprises titanium nitride (TiN).

According to embodiments of the two aspects of the invention, the multiple MTJ stacks have multiple types of the stress inducing layers for correspondingly manipulating the magnetic fields to different extents, wherein the types differ in at least one of the following criteria:
a) thickness,
b) material,
c) processing condition of deposition,
d) being in a single layer and in a stack of layers,
e) being tensile and compressive, and
f) being with and without a dummy layer between said free layer and said stress inducing layer.

According to embodiments of the two aspects of the invention, the free layer comprises a plurality of layers.

According to embodiments of the two aspects of the invention, the memory circuit is a magnetic random access memory (MRAM) circuit.

According to the embodiments of the invention, the stress inducing layer that is disposed adjacent to the free layer of the MTJ stack, provides tensile or compressive stress to the free layer in order to manipulate a magnetic field that is required to write a bit into the MTJ stack. Advantageously, this feature adds to the flexibility of design and operation of the memory circuit.

DETAILED DESCRIPTION

In the following description, for purposes of explanation, numerous specific details are set forth in order to provide a thorough understanding of the invention. It will be apparent, however, to one skilled in the art that the invention can be practiced without these specific details.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Broadly, embodiments of the invention disclose a magnetic memory circuit using addressable magnetic tunnel junction (MTJ) stack(s), wherein a stress inducing layer is disposed adjacent to a free layer of the MTJ stack. The stress inducing layer provides tensile or compressive stress to the free layer for manipulating a magnetic field or the write voltage, that is required to write a bit into the MTJ stack. Embodiments for methods of fabrication and operation of the memory circuit are also disclosed. Advantageously, this feature of stressing the free layer can be used to tune the write voltages required for flipping the free layer between the two states, and hence provide the memory circuit at desired ratings. The free layers in multiple MTJ stacks in the memory circuit can also be stressed differently to different extents, for being operable with different write voltages. Advantageously, these features increase the flexibility of design and operation of the memory circuit.

Figure 1:
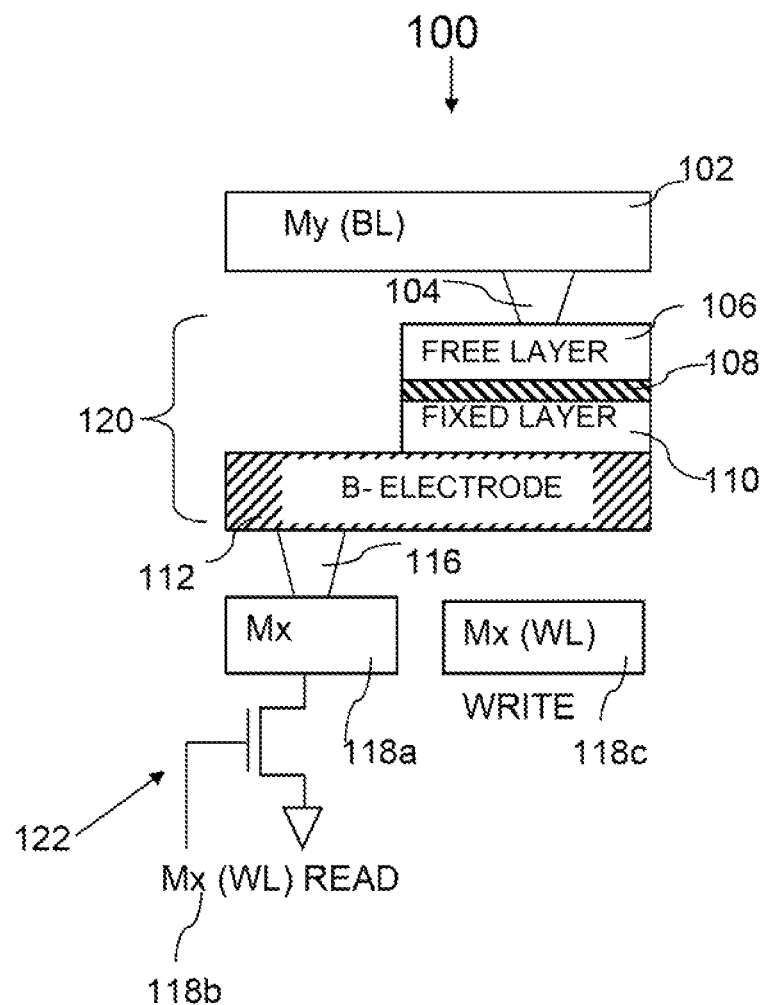
FIG. 1 illustrates a partly schematic and partly cross-sectional view of a magnetic bit cell. A magnetic tunnel junction (MTJ) stack is shown in the bit cell that includes a free layer, a tunnel oxide layer and a fixed layer.
Figure 2:
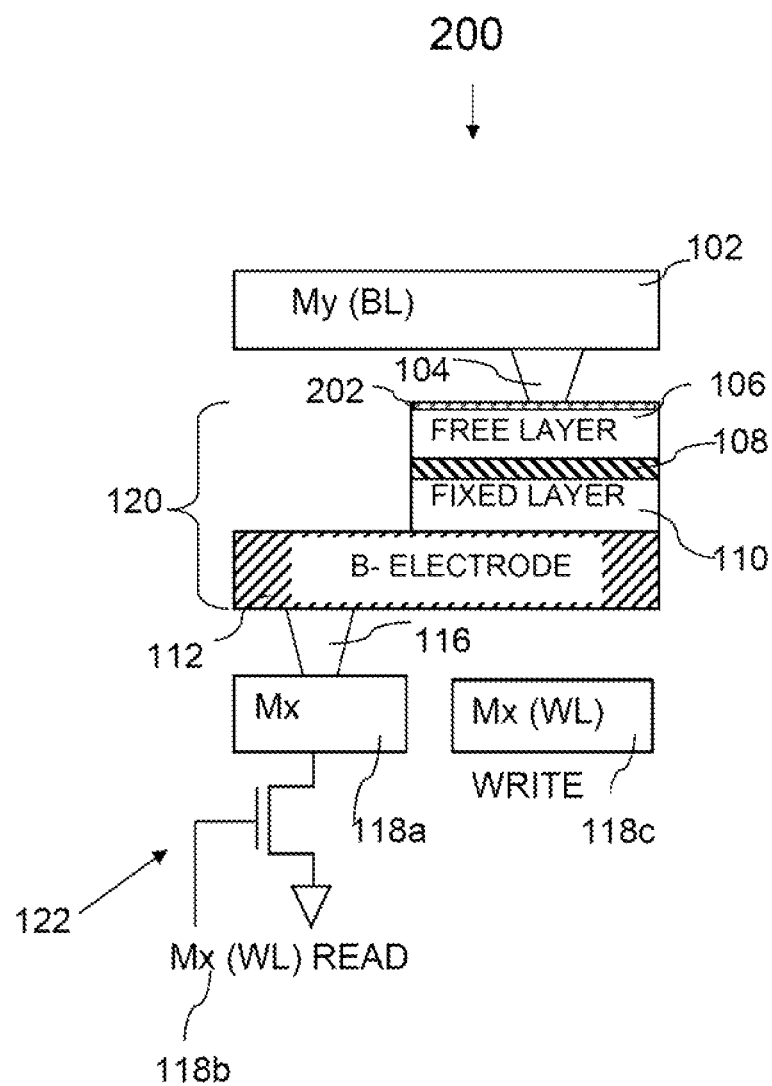
FIG. 2 illustrates the view at FIG. 1, with a stress inducing layer that is disposed adjacent to the free layer, according to an embodiment of the invention.

FIG. 2 illustrates a bit cell 200 similar to the bit cell 100 at FIG. 1, excepting that a stress inducing layer 202 is disposed adjacent to the free layer 106, according to an embodiment of the invention. The stress inducing layer 202 is for providing tensile or compressive stress to the free layer 106, in order to manipulate a magnetic field or a write voltage, that is required to write a bit into the MTJ stack 120. In another embodiment, the bit cell 200 is disposed in an array (not shown) to form the memory circuit. According to another embodiment, a dummy layer (not shown) is disposed between the free layer 106 and the stress inducing layer 202 on purpose, like for example, to improve adhesion between the stress inducing layer 202 and the free layer 106. The dummy layer may be composed of any material that is suitable to serve the purpose of its use. In various other embodiments, the stress inducing layer 202 may be composed of various suitable materials, like for example, a metal or titanium nitride (TiN).

According to another embodiment, the array of MTJ stacks 120 in the memory circuit has multiple types of the stress inducing layers 202, so that the magnetic fields or the write voltages can be manipulated to different extents. Different magnitudes of tensile and compressive stress can be achieved by altering the thickness or the material or the processing condition of deposition like the temperature of deposition, for the stress inducing layer 202. The stress inducing layer 202 may be in a single layer and in a stack of layers. Use of the dummy layer is also likely to influence the magnitude of the stress. Any other method of altering the tensile or compressive stress may equally be adopted.

The embodiments of the invention are equally applicable with configuration(s) having at least one of the free layer 106 and the fixed layer 110 being in multi-layers (not shown) and with coupling layers (not shown).

The embodiments of the invention are equally applicable with the stress inducing layer 202 being anywhere in the proximity of the free layer 106, as long as it is capable of stressing the free layer 106 for manipulating the magnetic field or the write voltage that is required to write a bit into the MTJ stack 120.

The embodiments of the invention are compatible with any semiconductor technology such as complementary metal-oxide-semiconductor (CMOS), bipolar-junction-transistor and CMOS (BiCMOS), silicon-on-insulator (SOI) and the like. The scope of the invention is also not limited to any particular technology in terms of processing sequence, materials, physical dimensions and the like.

Although the present invention has been described with reference to specific exemplary embodiments, it will be evident that the various modification and changes can be made to these embodiments without departing from the broader spirit of the invention. Accordingly, the specification and drawings are to be regarded in an illustrative sense rather than in a restrictive sense.

The invention claimed is:

1. A memory circuit comprising:
a plurality of magnetic tunnel junction (MTJ) stacks forming a corresponding plurality of magnetic storage elements in the memory circuit, wherein each of the plurality of MTJ stacks includes:
a tunnel oxide layer between a free layer and a fixed layer; and
a stress-inducing layer disposed above the free layer, wherein:
a first free layer of a first MTJ stack of the plurality of MTJ stacks is stressed to a first extent by a first stress-inducing layer of the first MTJ stack;
a second free layer of a second MTJ stack of the plurality of MTJ stacks is stressed to a second extent by a second stress inducing layer of the second MTJ stack; and
the first extent and the second extent are different.

2. The memory circuit of claim 1, wherein at least one of the plurality of MTJ stacks includes a dummy layer disposed between the free layer and the stress-inducing layer.

3. The memory circuit of claim 1, wherein the stress-inducing layer of at least one of the plurality of MTJ stacks comprises a metal.

4. The memory circuit of claim 1, wherein the stress-inducing layer of at least one of the plurality of MTJ stacks comprises titanium nitride (TiN).

5. The memory circuit of claim 1, wherein the free layer of at least one of the plurality of MTJ stacks comprises a plurality of layers.

6. The memory circuit of claim 1, wherein said memory circuit comprises a magnetic random access memory (MRAM) circuit.

7. The memory circuit of claim 1, wherein:
the first stress-inducing layer comprises a first thickness;
the second stress-inducing layer comprises a second thickness; and
the first thickness and the second thickness are different.

8. The memory circuit of claim 1, wherein:
the first stress-inducing layer comprises a first material;
the second stress-inducing layer comprises a second material; and
the first material and the second material are different.

9. The memory circuit of claim 1, wherein:
the first stress-inducing layer was deposited using a first processing condition;
the second stress-inducing layer was deposited using a second processing condition; and
the first processing condition and the second processing condition are different.

10. The memory circuit of claim 1, wherein:
the first stress-inducing layer is a single layer; and
the second stress-inducing layer comprises a plurality of layers.

11. The memory circuit of claim 1, wherein at least two of the stress-inducing layers comprise different magnitudes of tensile stress.

12. The memory circuit of claim 1, wherein:
the first stress-inducing layer provides a first magnitude of stress to the first free layer;
the second stress-inducing layer provides a second magnitude of stress to the second free layer; and the first magnitude of stress and the second magnitude of stress are different.

13. The memory circuit of claim 1, wherein:

a first one of the plurality of MTJ stacks includes a dummy layer disposed between the free layer and the stress-inducing layer; and a second one of the plurality of MTJ stacks does not have a dummy layer disposed between the free layer and the stress-inducing layer.

\* \* \* \* \*